United States Patent
Gurney et al.

(10) Patent No.: US 9,805,156 B2
(45) Date of Patent: Oct. 31, 2017

(54) SELECTIVE PARASITIC EXTRACTION

(71) Applicant: Mentor Graphics Corporation, Wllsonville, OR (US)

(72) Inventors: David J. Gurney, Portland, OR (US); Sandeep Koranne, West Linn, OR (US); Mingchao Wang, Tigard, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/142,201

(22) Filed: Dec. 27, 2013

(65) Prior Publication Data

US 2015/0186591 A1   Jul. 2, 2015

(51) Int. Cl.
 *G06F 17/50* (2006.01)
(52) U.S. Cl.
 CPC ...... *G06F 17/5081* (2013.01); *G06F 17/5036* (2013.01)
(58) Field of Classification Search
 USPC ........................................................ 716/116
 See application file for complete search history.

(56) References Cited

U.S. PATENT DOCUMENTS

| | | | |
|---|---|---|---|
| 7,600,208 B1* | 10/2009 | Sharma et al. | 716/120 |
| 2004/0199882 A1* | 10/2004 | Cao et al. | 716/4 |
| 2005/0125752 A1* | 6/2005 | Cannon et al. | 716/5 |
| 2007/0067747 A1* | 3/2007 | Checka et al. | 716/5 |
| 2010/0199236 A1* | 8/2010 | Chen et al. | 716/3 |
| 2010/0213590 A1* | 8/2010 | Warren et al. | 257/678 |
| 2011/0270598 A1* | 11/2011 | Zou et al. | 703/14 |

\* cited by examiner

*Primary Examiner* — Bryce Aisaka
(74) *Attorney, Agent, or Firm* — Banner & Witcoff, Ltd.

(57) ABSTRACT

This application discloses a computing system to pre-process a physical or geometric layout of a circuit design to determine various attributes of the nets, such as a location and a total capacitance for each net in the geometric layout. The computing system can order extraction of the nets from the geometric layout of the circuit design with a space filling curve based, at least in part, on the locations of the nets in the geometric layout of the circuit design and any coupling capacitance between the nets in the geometric layout of the circuit design. The computing system can selectively decouple nets with a coupling capacitance based, at least in part, on the total capacitance for the nets associated with the coupling capacitance. The computing system can generate an electrical representation for each of the extracted nets and write them to a netlist for the circuit design.

20 Claims, 9 Drawing Sheets

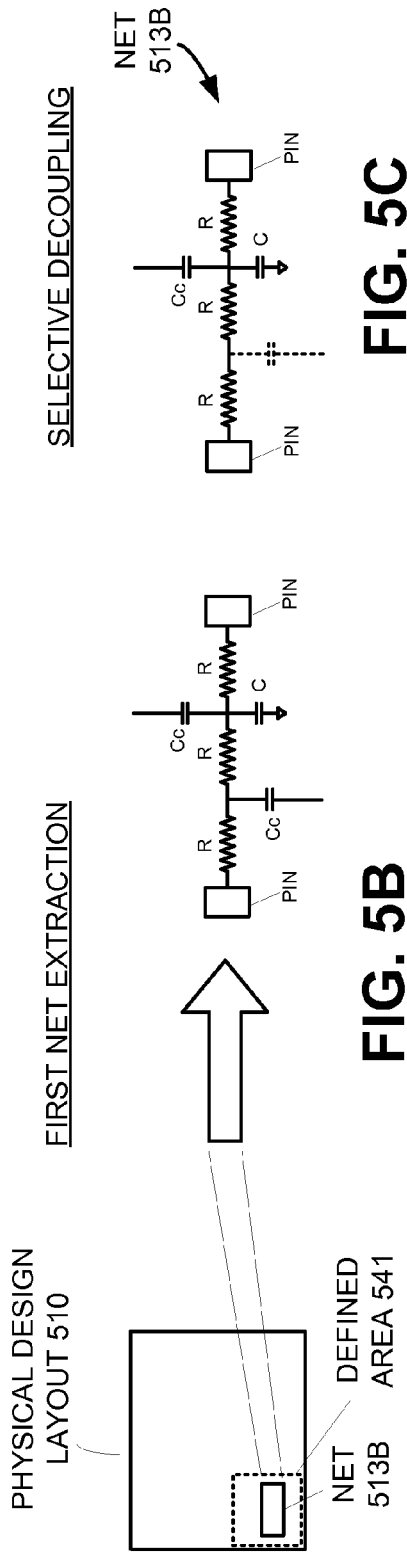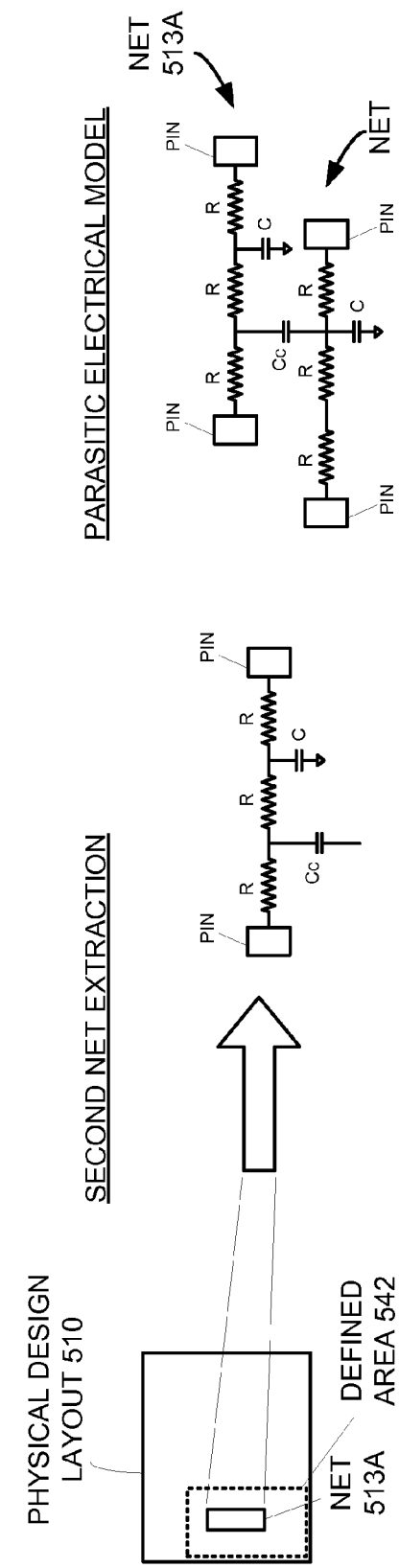

SELECTIVE PARASITIC EXTRACTION

TECHNICAL FIELD

This application is generally related to electronic design automation and, more specifically, to selective parasitic extraction.

BACKGROUND

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). As part of the creation of a logical design, a designer will also implement a place-and-route process to determine the placement of the various portions of the circuit, along with an initial routing of interconnections between those portions. The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices, such as transistors, resistors, and capacitors, which will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

After "formal verification," the design can be again transformed, this time into a physical design that describes specific geometric elements, often referred to as a "layout" design. The geometric elements, which typically are polygons, define the shapes that will be created in various materials to manufacture the circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Typically, a designer will perform a number of analyses on the resulting layout design data. For example, with integrated circuits, the layout design may be analyzed to confirm that it accurately represents the circuit devices and their relationships as described in the device design. The layout design may be analyzed to determine parasitic values, such as resistances, capacitances, inductances, or the like, of nets in the layout design, which can be utilized to determine whether the physical design includes voltage drops, signal delay, or signal noise. The layout design also may be analyzed to confirm that it complies with various design requirements, such as minimum spacings between geometric elements. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes, that modify the layout design data to improve the usable resolution of the reticle or mask created from the design in a photolithographic manufacturing process.

After the layout design has been finalized, it is converted into a format that can be employed by a mask or reticle writing tool to create a mask or reticle for use in a photolithographic manufacturing process. The written masks or reticles then can be used in a photolithographic process to expose selected areas of a wafer to light or other radiation in order to produce the desired integrated microdevice structures on the wafer.

Returning to the physical design analysis, as discussed above, the layout design can be transformed into a group of electrical representations or parasitic electrical models, which can be utilized to determine whether the physical design includes voltage drops, signal delay, signal noise, or the like. Specifically, a parasitic extraction tool can be utilized to perform parasitic extraction on the layout design, for example, extracting nets from the layout design, determining parasitic electrical models from the extracted nets, and writing the parasitic electrical models to a netlist.

For typical layout designs, most of the parasitic electrical models include an electrical representation of one extracted net, as each net is typically intended to be electrically-independent from other nets in the layout design. However, since most layout designs include nets that experience an unintended exchange of electromagnetic fields—often called noise or cross-talk—some of the parasitic electrical models include electrical representations of multiple different nets coupled with a capacitance representing the noise or cross-talk between the nets.

Since the parasitic extraction tool determines whether nets experience an unintended exchange of electromagnetic fields during the generation of electrical representations of extracted nets, the parasitic extraction tool completes the generation of a parasitic electrical model having parasitic values for multiple nets and writes the parasitic electrical model to the netlist after each capacitively coupled net has been extracted and converted into its electrical representation. Due to memory and processing resource consumption, the parasitic extraction tool often performs parasitic extraction on a net-by-net basis, meaning that when an extracted net is determined to capacitively couple to at least another net, the parasitic extraction tool stores the electrical representation in memory until all nets coupled together have been extracted and converted into their electrical representations. When too many partially-completed parasitic electrical models are stored in memory awaiting capacitively coupled net extraction, the parasitic extraction tool may have limited remaining local memory to extract larger nets in the layout design without off-loading the currently stored nets to hard disk, both of which can slow overall performance.

In smaller feature size designs, such as 20 nm or 16 nm designs, many physical layouts include trace lines having a reduced footprint, but increased height—often having sidewalls around 8 times larger than a width of the trace lines. While this trace line configuration can avoid increasing trace line resistance in these smaller feature size designs, the increased surface area of the sidewalls can more readily exchange electromagnetic fields, passing noise between adjacent trace lines. During physical design analysis, this increase in unintended noise or cross-talk between nets, can render parasitic extraction intensive in identifying and linking electrically-coupled nets as well as in storing extracted nets (or their electrical representations) until all electrically-coupled nets have been extracted, combined into a parasitic electrical model, and written to a netlist. Some systems off-load the extracted nets (or their electrical representations) to a hard disk memory until the entire parasitic electrical model can be generated and written to a netlist, which can preserve a local memory for processing recently extracted nets. Although this technique can help alleviate some of the burden imposed on the local memory, it often slows the generation of the parasitic electrical models and the corresponding netlist by several orders of magnitude.

SUMMARY

This application discloses tools and mechanisms to perform a sequenced extraction of nets from a geometric or physical layout of a circuit design, for example, to avoid excess consumption of system resources, and then generate a netlist for the circuit design with electrical representations of the extracted nets. According to various embodiments, the tools and mechanisms can pre-process the physical layout of the circuit design to determine various attributes of the nets, such as a location and a total capacitance for each net in the physical layout. The tools and mechanisms can order extraction of the nets from the physical layout of the circuit design based on the locations of the nets in the physical layout. In some embodiments, the tools and mechanisms can utilize a space filling curve to define successive areas of the physical layout to evaluate for net extraction. The tools and mechanisms can evaluate the defined areas to determine whether the defined areas encapsulate any nets or groups of nets capacitively coupled together. The tools and mechanisms can selectively decouple capacitive couplings between nets during extraction of a net based on the total capacitance for the nets corresponding to the capacitive couplings.

DESCRIPTION OF THE DRAWINGS

FIGS. 5A-5E illustrate an example implementation of selective parasitic extraction according to various embodiments of the invention.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
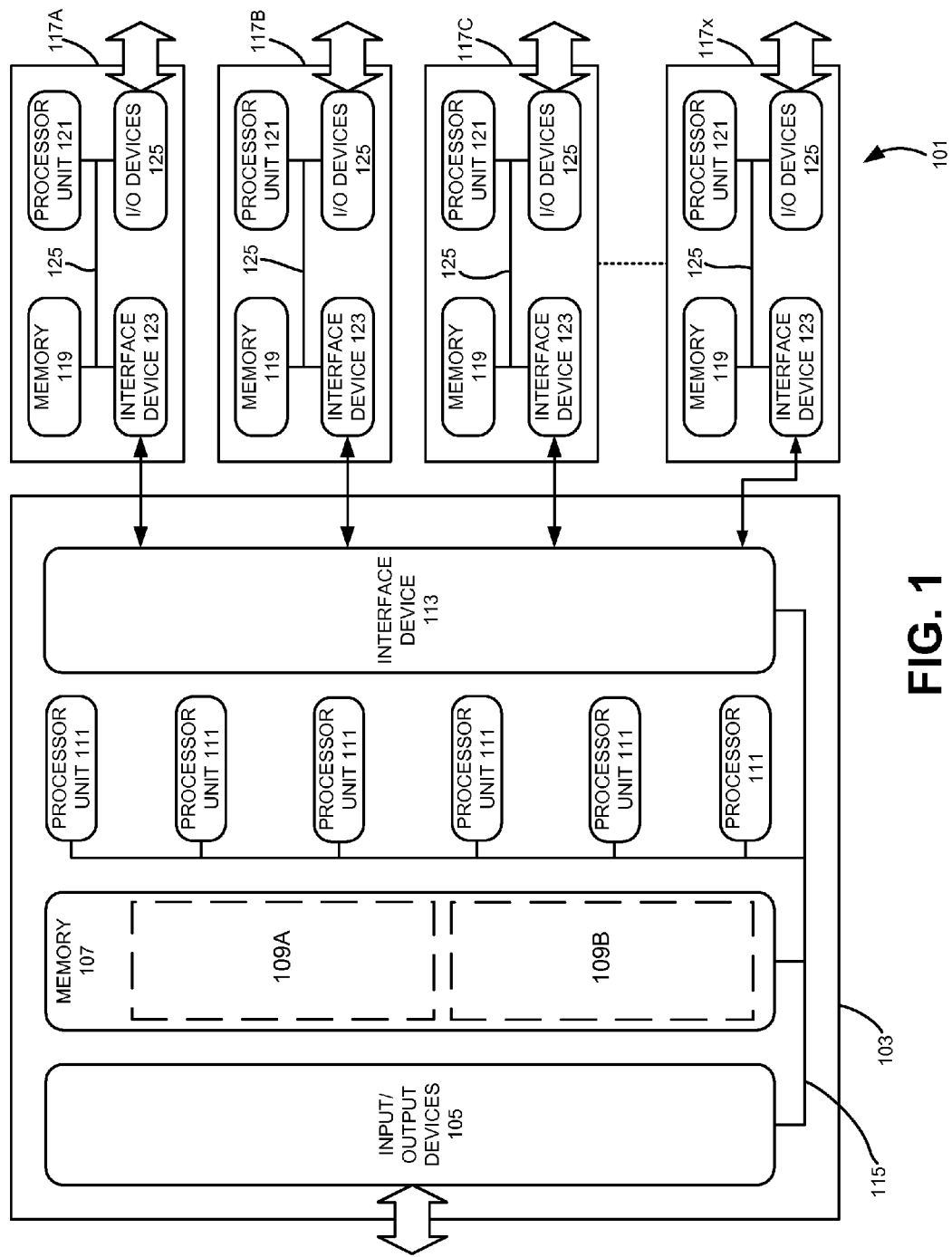
FIGS. 1 and 2 illustrate an example of a computer system of the type that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention.

Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
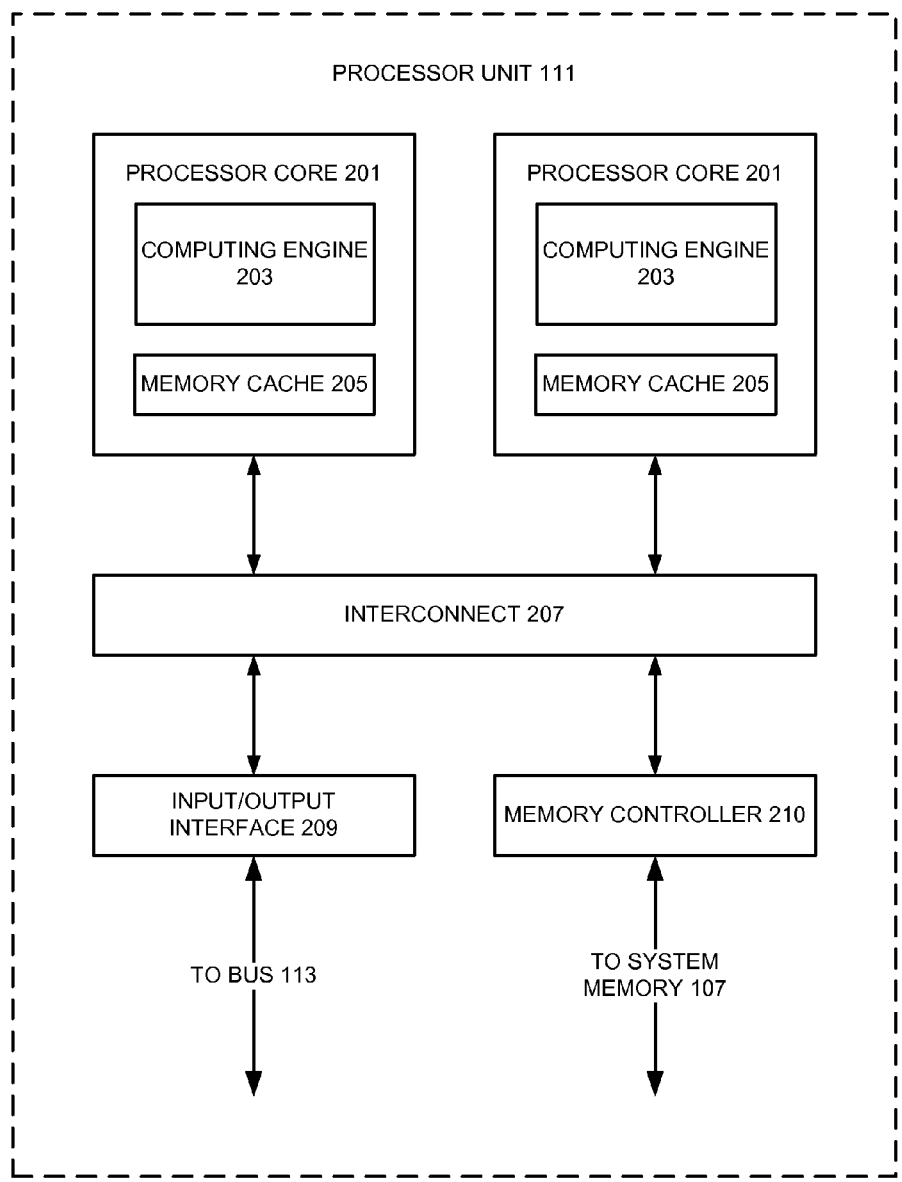

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Selective Parasitic Extraction

Figure 3:
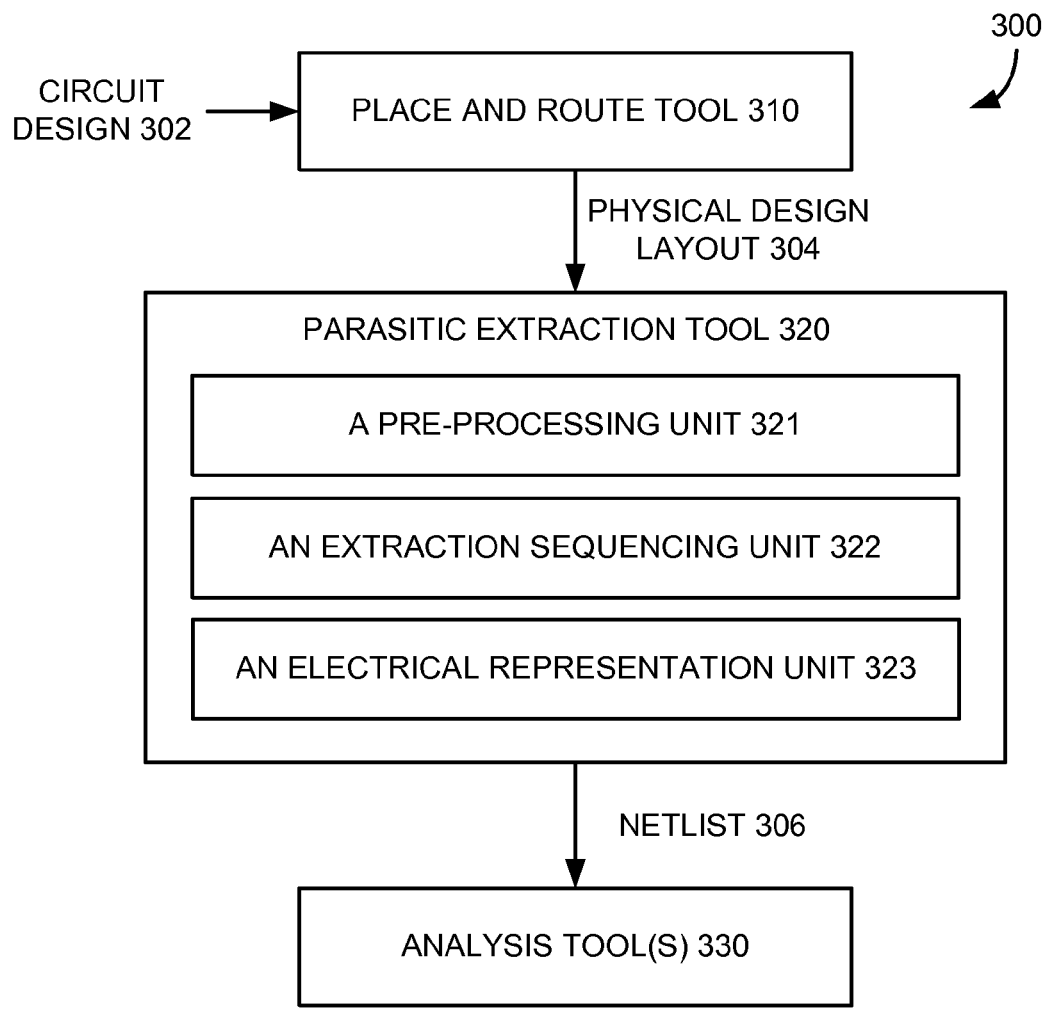
FIG. 3 illustrates an example of design system including a parasitic extraction tool that may be implemented according to various embodiments of the invention.

FIG. 3 illustrates an example of a design system 300 including a parasitic extraction tool 320 that may be implemented according to various embodiments of the invention. Referring to FIG. 3, the design system 300 can include a place and route tool 310 to receive a circuit design 302, which can describe an electronic device both in terms of an exchange of data signals between clock-driven circuits in the electronic device, such as hardware registers, flip-flops, or the like, and in terms of logical operations that can be performed on the data signals by combinational logic in the electronic device. The circuit design 302 can model the electronic device at a register transfer level (RTL), for example, with code in a hardware description language (HDL), such as Verilog, Very high speed integrated circuit Hardware Design Language (VHDL), or the like.

The place and route tool 310 can generate a physical design layout 304 from the circuit design 302, for example, to describe the electronic device in terms of planar geometric shapes corresponding to patterns of metal, oxide, or semiconductor layers that make up components of the electronic device. In some embodiments, the physical design layout 304 can describe or model the electronic device in a Library Exchange Format (LEF), a Design Exchange Format (DEF), or the like.

The design system 300 can include a parasitic extraction tool 320 to receive the physical design layout 304 from the place and route tool 310 and perform parasitic extraction on the physical design layout 304. For example, the parasitic extraction tool 320 can convert the physical design layout 304 into an electrical representation, such as a group of electrically-independent parasitic models, and generate a netlist 306 including the electrical representation of the physical design layout 304. In some embodiments, the netlist 306 can describe or model the electronic device in a Standard Parasitic Exchange Format (SPEF), or the like.

The parasitic extraction tool 320 can include a pre-processing unit 321 to analyze the physical design layout 304 prior to performance of the parasitic extraction. For example, the pre-processing unit 321 can identify locations of nets within the physical design layout 304 and estimate a total capacitance value for each of the nets in the physical design layout 304. Each net can describe wires or electrical paths interconnecting components between pins or ports in the physical design layout 304. The total capacitance value can correspond to an aggregation of capacitances-to-ground in corresponding nets of the physical design layout 304, while, in some instances, not including coupling capacitances between nets. In some embodiments, the estimate of the total capacitance value for each net can be smaller than an actual capacitance value for each net.

The parasitic extraction tool 320 can include an extraction sequencing unit 322 to determine an order that the parasitic extraction tool 320 extracts nets from the physical design layout 304 based, at least in part, on the locations of the nets within the physical design layout 304. In some embodiments, the extraction sequencing unit 322 can utilize a space filling curve, such as a Z-curve, Morton curve, Hilbert curve, or the like, to sequentially define areas or spaces within the physical design layout 304 to evaluate for nets to extract. In some examples, the parasitic extraction tool 320 can extract nets from the physical design layout 304 when they are fully encapsulated in the defined area under evaluation. Since each of the areas defined by the space filling curve cumulatively includes any previously defined areas, the space filling curves can systematically grow an area under evaluation to ensure all nets can be extracted by the parasitic extraction tool 320.

Figure 4B:
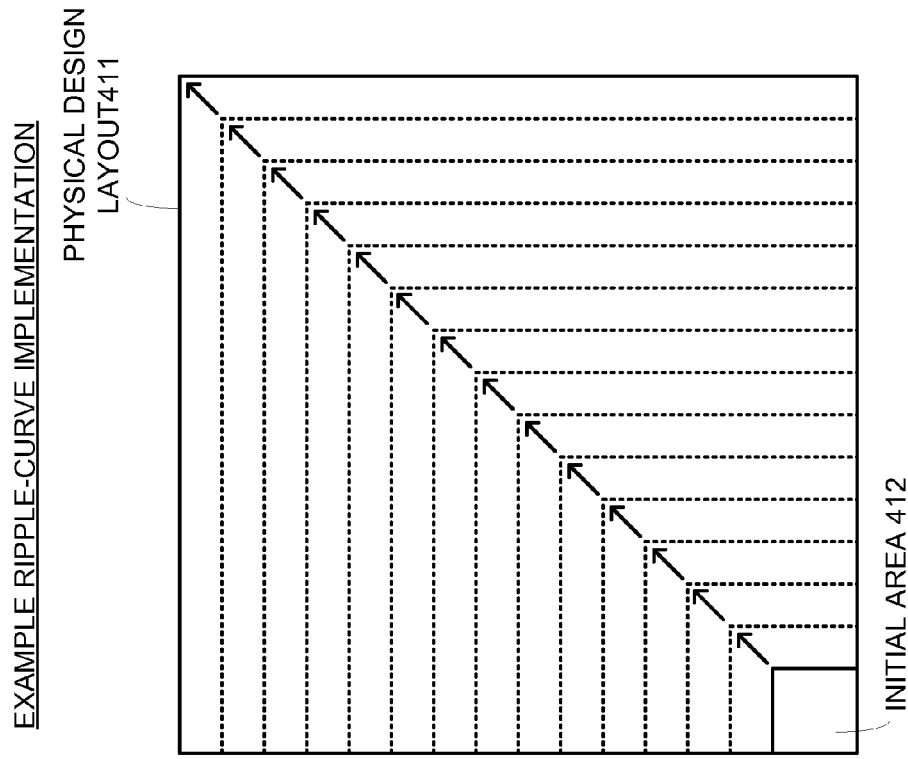
FIGS. 4A and 4B illustrate example implementations of space filling curves according to various embodiments of the invention.
Figure 4A:
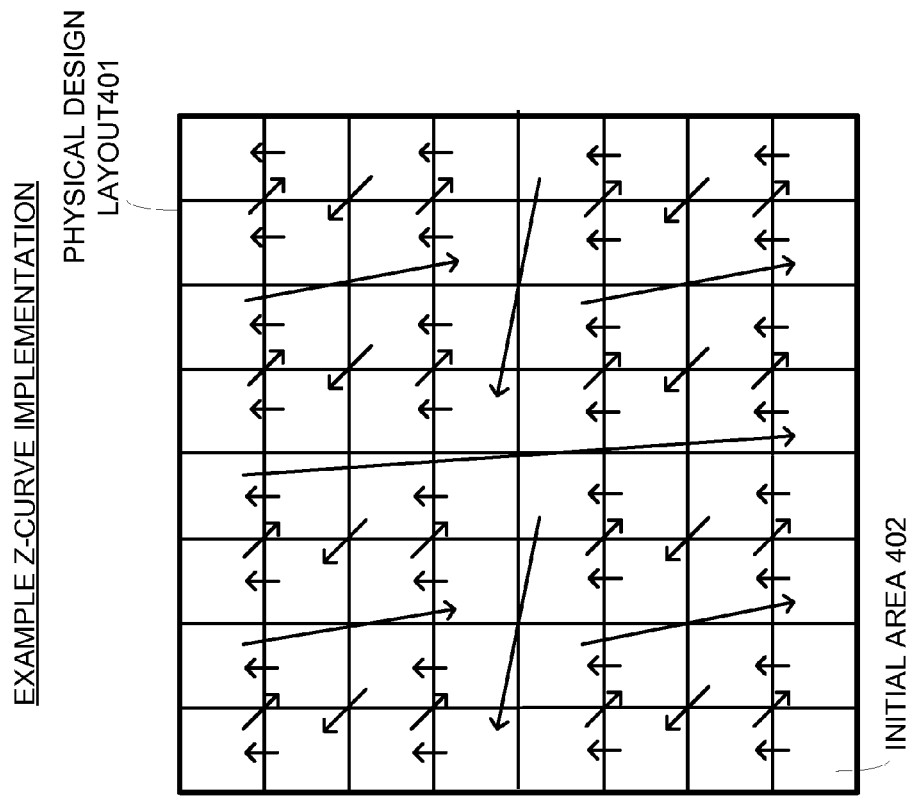

FIGS. 4A and 4B illustrate example implementations of space filling curves according to various embodiments of the invention. Referring to FIG. 4A, an example Z-curve implementation is shown. A parasitic extraction tool, such as tool 310, can utilize the z-curve to define areas in a physical design layout 401 to evaluate for a presence of nets.

The z-curve can identify an initial area 402, which can correspond to a first defined area to evaluate for nets to extract. The parasitic extraction tool can review the initial area 402 for the presence of nets, and perform parasitic extraction on any nets in the initial area 402. In some embodiments, the parasitic extraction tool can extract nets encapsulated by the initial area 402, while leaving nets partially-included in the initial area 402 for later.

After the parasitic extraction tool has evaluated the initial area 402, the parasitic extraction tool utilizing the z-curve can define a new area, which can include the initial area 402 and a new area of the physical design layout 401, to evaluate for nets. FIG. 4A includes arrows to illustrate the iterative growth of the initial area 402 into successively larger areas. Although FIG. 4A shows the initial area 402 being in the lower-left-hand corner of the physical design layout 401 and growing up and to the right of the initial area 402, in some embodiments, the initial area 402 can be located anywhere in the physical design layout 401 and grow in any direction around the initial area 402.

Referring to FIG. 4B, an example ripple-curve implementation is shown. A parasitic extraction tool, such as tool 310, can utilize the ripple-curve to define areas in a physical design layout 411 to evaluate for a presence of nets.

The ripple-curve can identify an initial area 412, which can correspond to a first defined area to evaluate for nets to extract. The parasitic extraction tool can review the initial area 412 for the presence of nets, and perform parasitic extraction on any nets in the initial area 412. In some embodiments, the parasitic extraction tool can extract nets encapsulated by the initial area 412, while leaving nets partially-included in the initial area 412 for later.

After the parasitic extraction tool has evaluated the initial area 412, the parasitic extraction tool utilizing the ripple-curve can define a new area, which can include the initial area 412 and a new area of the physical design layout 411, to evaluate for nets. FIG. 4B includes arrows to illustrate the iterative growth of the initial area 412 into successively larger areas. Although FIG. 4B shows the initial area 412 being in the lower-left-hand corner of the physical design layout 411 and growing up and to the right of the initial area 412, in some embodiments, the initial area 412 can be located anywhere in the physical design layout 411 and grow in any direction around the initial area 412.

Referring back to FIG. 3, the parasitic extraction tool 320 can include an electrical representation unit 323 to extract nets from the physical design layout 304 based on the locations of the nets in the physical design layout 304 relative to an area defined by the extraction sequencing unit 322. In some embodiments, electrical representation unit 323 can extract a net from the physical design layout 304 when the net is fully encapsulated in the area defined by the extraction sequencing unit 322. Since the size of the area defined by the extraction sequencing unit 322 grows with each successive iteration, the electrical representation unit 323 can order net extraction to generally extract smaller nets before larger nets, and to generally extract adjacent nets rather than spatially separated nets. As will be described below in greater detail, this net extraction ordering can allow for electrical representations of the extracted nets to be written to the netlist 306 efficiently, i.e., with less memory consumption and/or faster processing time than the conventional approach.

The electrical representation unit 323 can identify parasitic values in each net extracted from the physical design layout 304 and generate an electrical representation of each extracted net based on the parasitic values. The parasitic values can include resistances in the nets, capacitances between the net and a ground plane having a corresponding ground voltage, coupling capacitances between proximate nets, inductances, or the like. In some embodiments, the coupling capacitance in the electrical representation can model noise or cross-talk in the net due to exchange of electromagnetic fields between multiple nets.

The electrical representation unit 323 can determine whether the electrical representation of a net is electrically-independent or isolated from other nets in the physical design layout 304, for example, based on a presence of a coupling capacitance in the electrical representation. When the electrical representation of the net is electrically-independent or isolated from other nets in the physical design layout 304, e.g., does not experience noise or cross-talk with an adjacent net, the electrical representation unit 323 can write the electrical representation of the net to the netlist 306, in some embodiments, without waiting to extract other nets from the physical design layout 304.

Conversely, when an electrical representation of a first net includes at least one coupling capacitance associated with a second net in the physical design layout 304, the electrical representation unit 323 can combine electrical representations of the first and second nets into a parasitic model, which can be written to the netlist 306. Since the order of net extraction can sometimes have one or more nets being extracted between the first and second nets, the electrical representation unit 323 can store the electrical representation for one of the nets while waiting for the other one of the nets to be extracted. Further, the electrical representation unit 323 can identify one or more additional coupling capacitances in the subsequently extracted net, which may cause the electrical representation unit 323 to store electrical representations of the first and second nets, while waiting for additional nets to be extracted. Once the electrical representation unit 323 extracts all electrically capacitively coupled nets and combines their electrical representations into the parasitic model, the parasitic model can be written to the netlist 306 and the memory freed from storing the electrical representations of the extracted nets.

In some embodiments, the electrical representation unit 323 can assume "small" coupling capacitances would have limited electrical effect on the operation of the electronic device modeled by the physical design layout 304 and exclude them from the netlist 306. For example, during parasitic extraction, the electrical representation unit 323 can identify these "small" coupling capacitances, oftentimes prior to extracting both nets corresponding to the coupling capacitances, and then decouple or remove the coupling capacitances from the electrical representation of at least one of the nets corresponding to the coupling capacitances. In some embodiments, the removed coupling capacitances can be replaced by a capacitance to the ground plane having a same or similar capacitance value as the coupling capacitance. By decoupling the coupling capacitance during parasitic extraction and prior to extracting both nets corresponding to the coupling capacitances, the electrical representation unit 323 can write an electrical representation of the decoupled net to the netlist 306 without having to first wait for the electrical representation unit 323 to extract all nets capacitively coupled together in the physical design layout 304.

In some embodiments, the electrical representation unit 323 can selectively decouple the coupling capacitance from the electrical representation of the net by generating an estimated value of the coupling capacitance based on electrical information from the extracted net and comparing the estimated value of the coupling capacitance to the total capacitances of the corresponding nets. In some embodiments, the electrical representation unit 323 can calculate the coupling capacitance between two nets utilizing the following equation.

$$C_C = \frac{2*(C_{C12}*C_{C2})}{(C_{C12}+C_{C21})} \qquad \text{Equation 1}$$

The electrical representation unit 323 can calculate the coupling capacitance $C_C$ between a first net and a second net with a value of the coupling capacitance $C_{C12}$ from a first extracted net and a value of the coupling capacitance $C_{C21}$ from a second extracted net. When the electrical representation unit 323 has only extracted one of the first or second nets, e.g., only having one of the two net-side coupling capacitances $C_{C12}$ and $C_{C21}$, the electrical representation unit 323 can estimate a value for the coupling capacitance $C_C$ by substituting the known net-side coupling capacitance $C_{C12}$ or $C_{C21}$, for the unknown net-side coupling capacitance $C_{C12}$ or $C_{C21}$. This substitution can allow the electrical representation unit 323 to conservatively estimate the coupling capacitance $C_C$, for example, with an equal or larger value than the actual coupling capacitance $C_C$, without having to extract both nets from the physical design layout 304.

The electrical representation unit 323 can utilize Equation 2 to determine whether to decouple the coupling capacitance from the electrical representation of the net.

$$\frac{\text{est. } C_c}{\min(C_{Ta}, C_{Tb})} < \text{Decoupling Threshold} \qquad \text{Equation 2}$$

As discussed above, the electrical representation unit 323 can generate the estimate of the coupling capacitance Cc from one of the two nets corresponding to the coupling capacitance, which can have a value greater than or equal to an actual value for the coupling capacitance capable of being determined utilizing both of the nets corresponding to the coupling capacitance. In some embodiments, the decoupling threshold can correspond to 3%, thus allowing the electrical representation unit 323 to decouple a coupling capacitance when the estimated coupling capacitance Cc is less than 3% of $\min(C_{Ta}, C_{Tb})$ or the smallest of the total capacitances for the nets corresponding to the coupling capacitance. Since the estimated coupling capacitance Cc can be equal or larger than the actual value of the coupling capacitance and since the estimated total capacitance for the unextracted net can be smaller than the actual total capacitance for the unextracted net, the total value of the left-side of the inequality in Equation 2 can be conservatively higher than it would be if utilizing actual values for the nets being examined.

Since, in many cases, both of the nets corresponding to the coupling capacitances have not been extracted when the electrical representation unit 323 determines whether to selectively decouple the coupling capacitances, the parasitic extraction tool 320 can avoid storing an electrical representation of an extracted net until the other capacitively coupled net is extracted from the physical design layout 304, combined with the electrical representation of the subsequently extracted net, and written to the netlist 306. In other words, decoupling capacitances between nets during parasitic extraction allows the electrical representation unit 323 to write parasitic models of extracted nets to the netlist 306, freeing memory previously utilized to hold the extracted nets until their corresponding capacitively coupled nets and any net capacitively coupled to that net, and so on, were extracted from the physical design layout 304.

Since parasitic extraction can cause unpredictable memory consumption due to unintended capacitive coupling between nets, the parasitic extraction tool 320 can order the net extraction utilizing a shape filling curve to select nets for extraction, such as smaller nets, which have a higher probability of being able to be written to the netlist 306 rather than stored in memory. When the parasitic extraction tool 320 extracts a net that has capacitive coupling, the parasitic extraction tool 320 has the ability to selectively decouple the capacitive coupling, oftentimes prior to extraction of the coupled net. Further, when the parasitic extraction tool 320 extracts a net that has a capacitive coupling that cannot be decoupled, the parasitic extraction tool 320 can select subsequent nets for extraction that have a higher probability to correspond to the capacitive coupling, as the shape filling curve generally selects nets in close proximity to each other, which can allow the nets to be combined and written to the netlist 306—freeing the memory allocated to storing the extracted net.

The design system 300 can include one or more analysis tools 330 to receive the netlist 306 from the parasitic extraction tool 320 and perform physical verification on the physical design layout 304. For example, the analysis tools 330 can evaluate the electrical representation of the physical design layout 304 in the netlist 306 to determine whether the electronic device modeled in the physical design layout 304 may experience electrical violations, such as voltage drops, signal delay, or signal noise.

Figure 5A:
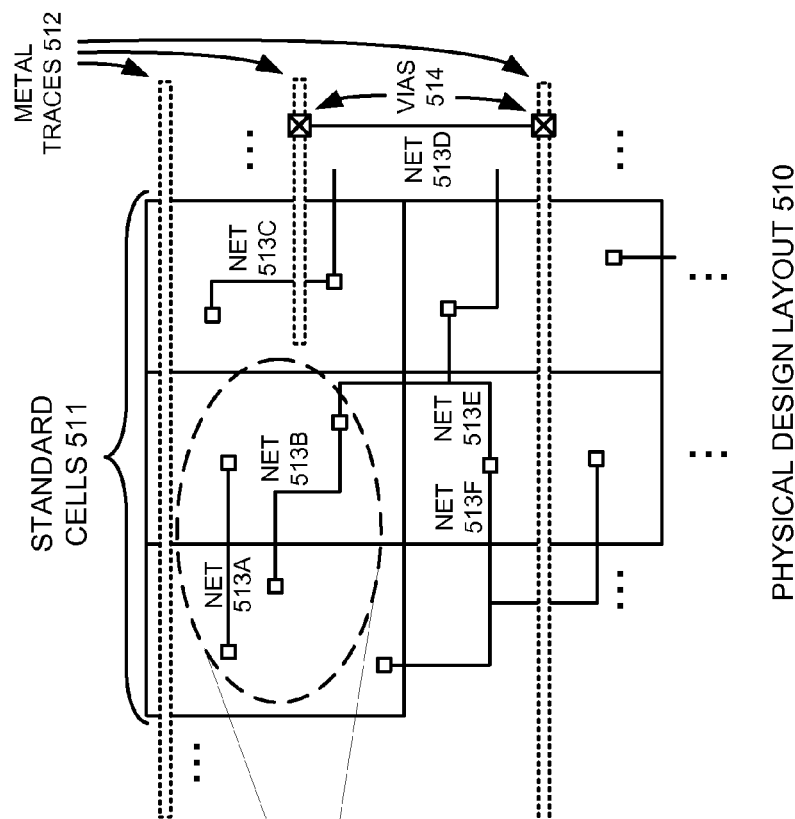
Figure 5A:
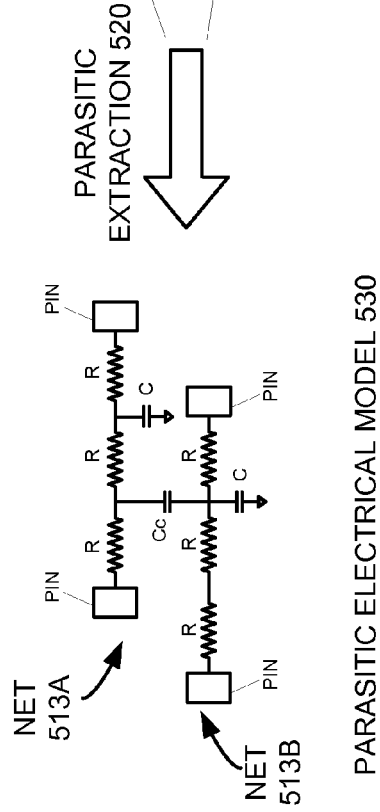

FIGS. 5A-5E illustrate an example implementation of selective parasitic extraction according to various embodiments of the invention. Referring to FIG. 5A, a physical design layout 510 can describe an electronic device in terms of planar geometric shapes corresponding to patterns of metal, oxide, or semiconductor layers that make up components of the electronic device. In some embodiments, the physical design layout 510 can describe or model the electronic device in a Library Exchange Format (LEF), a Design Exchange Format (DEF), or the like.

The physical design layout 510 can include an array of standard cells 511, each including circuitry, such as a group of one or more transistors and interconnect structures to provide, for example, Boolean logic, storage, or the like, and at least one pins coupled to the circuitry. The physical design layout 510 can include nets 513A-513F to describe wires or electrical paths between pins in the physical design layout 304, for example, to interconnect circuitry in the standard cells 511. The physical design layout 510 also can include additional metal layers, such as metal traces 512, and vias 514 to interconnect different layers of the physical design layout 510.

During parasitic extraction, a parasitic extraction tool can extract nets from the physical design layout 510 and convert the nets 513 into one or more corresponding electrical representations. For simplicity, FIG. 5A shows the parasitic extraction of nets 513A and 513B and their conversion into a parasitic electrical model 530. The parasitic electrical model 530 can include an electrical representation of net 513A coupled to an electrical representation of net 513B with coupling capacitors $C_C$.

Referring to FIGS. 5B-5E, the extraction and conversion of nets 513A and 513B into the parasitic electrical model 530 can include multiple steps. The parasitic extraction tool can perform a first net extraction of the net 513B from a defined area 541 of the physical design layout 510 and convert the net 513B into an electrical representation. The electrical representation can include resistors R to model line resistance in the net 513B, a capacitor C to model capacitances between the net 513B and a ground voltage, and coupling capacitors $C_C$ to model capacitances between the net 513B and other nets in the physical design layout 510.

The parasitic extraction tool can attempt to decouple the coupling capacitances, for example, removing the coupling capacitors $C_C$ from the electrical representation of the net 513B and replacing the removed coupling capacitors $C_C$ with a grounded capacitor having a same or similar capacitance value. In this example, the parasitic extraction tool decoupled one of the coupling capacitances, as illustrated by the dashed coupling capacitor $C_C$, while retaining the other coupling capacitors $C_C$. As discussed above, the parasitic extraction tool can selectively decouple the coupling capacitances by estimating a value of the coupling capacitances from the extracted net 513B and then comparing the estimated value of the coupling capacitances to the total capacitances of net 513A and 513B, for example, determined prior to initiation of the parasitic extraction. The parasitic extraction tool can store the electrical representation of net 513B in memory until the net 513A corresponding to the coupling capacitance in net 513B is extracted by the parasitic extraction tool.

The parasitic extraction tool can perform a second net extraction of the net 513A from a defined area 542 of the physical design layout 510 and convert the net 513A into an electrical representation. The electrical representation can include resistors R to model line resistance in the net 513A, a capacitor C to model capacitances between the net 513A and a ground voltage, and a coupling capacitor $C_C$ to model capacitances between the net 513A and net 513B.

The parasitic extraction tool can retrieve the electrical representation of net 513B from memory and combine the electrical representations of the nets 513A and 513B, which can be joined by their common coupling capacitor $C_C$, into a parasitic electrical model 530. Since neither net 513A nor 513B has any other coupling capacitances, the parasitic extraction tool can write the parasitic electrical model 530 to a netlist, and then proceed to identify any other nets in the physical design layout 510 to extract, convert into their electrical representations, and write to the netlist.

Figure 6:
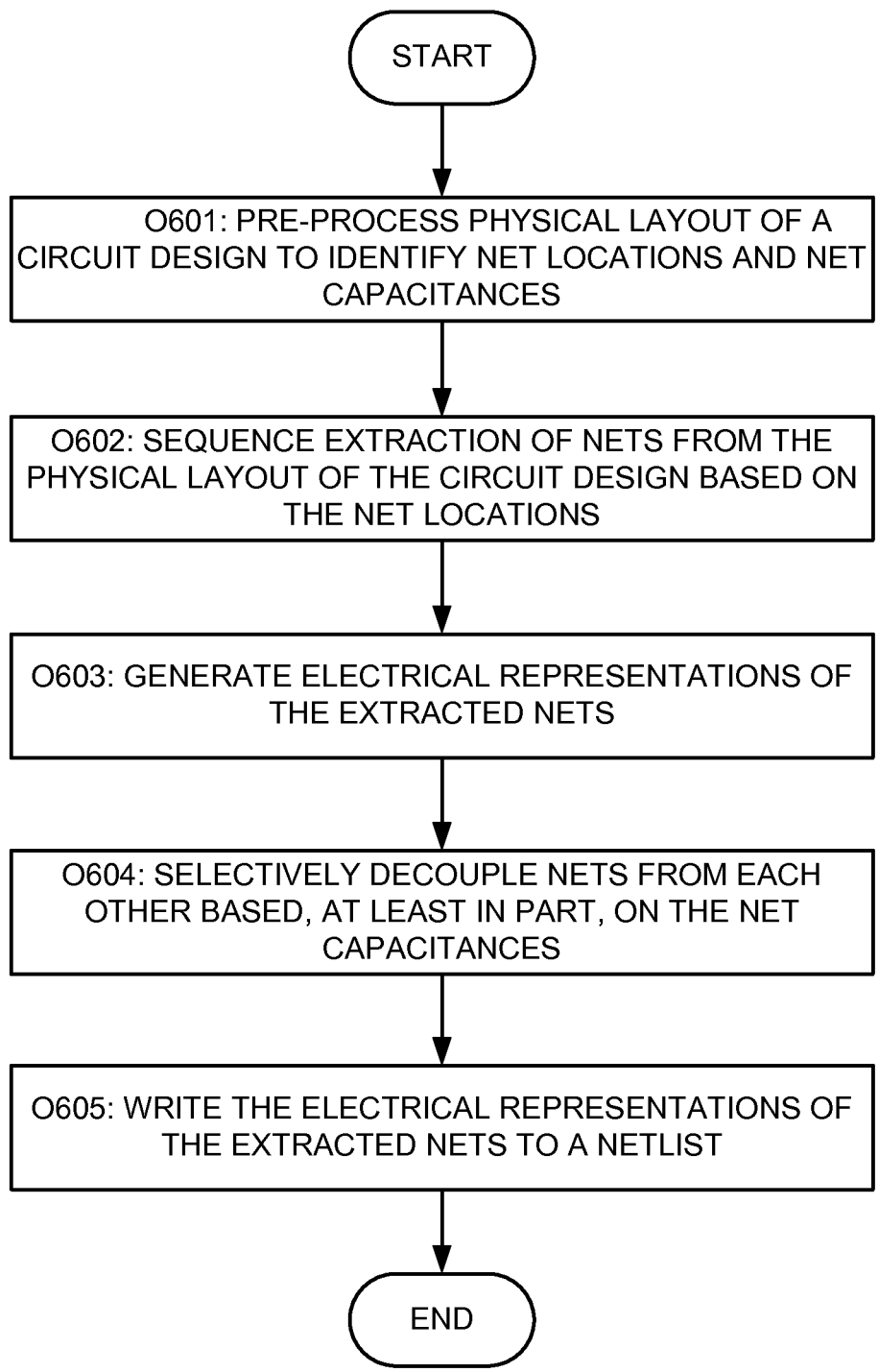
FIG. 6 illustrates a flowchart showing an example implementation of selective parasitic extraction according to various examples of the invention.

FIG. 6 illustrates a flowchart showing an example implementation of selective parasitic extraction according to various examples of the invention. Referring to FIG. 6, in a block 601, a parasitic extraction tool can pre-process a physical layout of a circuit design to identify net locations and total net capacitances for each net in a physical layout. The total net capacitance can correspond to an aggregation of capacitances-to-ground in corresponding nets of the physical layout, while, in some instances, not including coupling capacitances between nets.

In a block 602, the parasitic extraction tool can sequence extraction of nets from the physical layout of the circuit design based on the net locations. In some embodiments, the parasitic extraction tool can utilize a space filling curve, such as a Z-curve, Morton curve, Hilbert curve, or the like, to sequentially define areas or spaces within the physical layout to evaluate for nets to extract. In some examples, the parasitic extraction tool can extract nets from the physical layout when they are encapsulated in the defined area under evaluation. Since each of the areas defined by the space filling curve cumulatively includes any previously defined areas, the space filling curves can systematically grow an area under evaluation to ensure all nets can be extracted by the parasitic extraction tool.

In a block 603, the parasitic extraction tool can generate electrical representations of the extracted nets. The parasitic extraction tool can identify parasitic values in each net extracted from the physical layout and generate an electrical representation of each extracted net based on the parasitic values. The parasitic values can include resistances in the nets, capacitances between the net and a ground plane, coupling capacitances between adjacent nets, inductances, or the like. In some embodiments, the coupling capacitance in the electrical representation can model noise or cross-talk in the net due to exchange of electromagnetic fields between multiple nets.

In a block 604, the parasitic extraction tool can selectively decouple nets from each other based, at least in part, on the total net capacitances. The parasitic extraction tool can assume "small" coupling capacitances would have limited electrical effect on the operation of the electronic device modeled by the physical layout and thus eliminate them from the electrical representation of the corresponding nets.

In some embodiments, the parasitic extraction tool can selectively decouple the coupling capacitance from the electrical representation of an extracted net by generating an estimated value of the coupling capacitance based on electrical information from the extracted net and comparing the estimated value of the coupling capacitance to the total capacitances of the corresponding nets, for example, generated during pre-processing in block 601.

In a block 605, the parasitic extraction tool can write the electrical representations of the extracted nets to a netlist. The parasitic extraction tool can determine whether the electrical representations of extracted nets are electrically-independent or isolated from other nets in the physical layout, for example, based on a presence of a coupling capacitance in any electrical representation not combined with an electrical representation of another extracted net. When the electrical representations of the extracted nets are electrically-independent or isolated from other nets in the physical design layout, the parasitic extraction tool can write the electrical representations of the extracted nets to the netlist.

Figure 7:
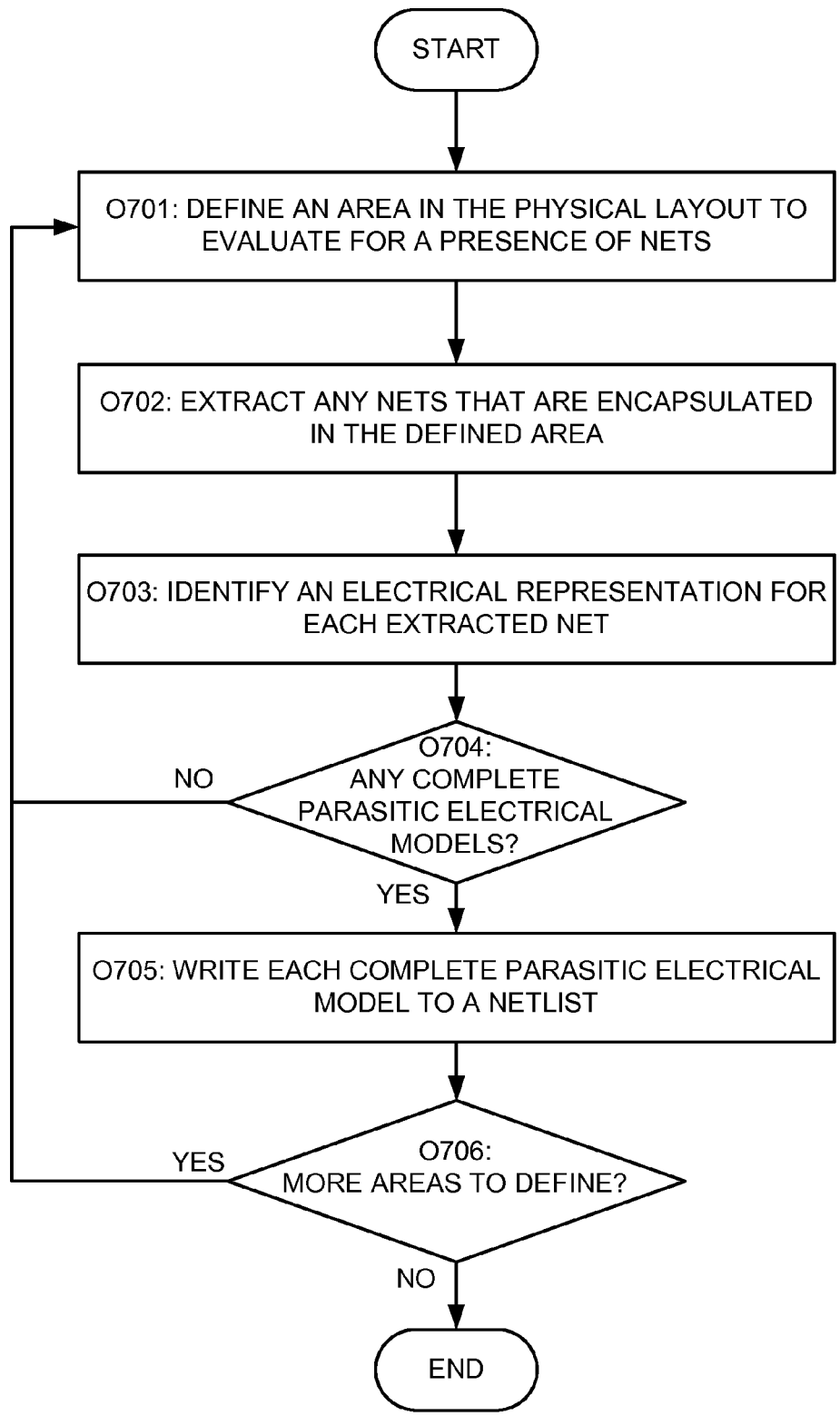
FIG. 7 illustrates a flowchart showing an example implementation of ordered selection of net extraction according to various examples of the invention.

FIG. 7 illustrates a flowchart showing an example implementation of ordered selection of net extraction according to various examples of the invention. Referring to FIG. 7, in a block 701, a parasitic extraction tool can define an area in the physical layout to evaluate for a presence of nets. In some embodiments, the parasitic extraction tool can utilize a space filling curve, such as a Z-curve, Morton curve, Hilbert curve, or the like, to sequentially define the area within the physical layout. Since each of the areas defined by the space filling curve cumulatively includes any previously defined areas, the space filling curves can systematically grow an area under evaluation to ensure all nets can be extracted by the parasitic extraction tool.

In a block 702, the parasitic extraction tool can extract any nets that are encapsulated in the defined area. In a block 703, the parasitic extraction tool can identify an electrical representation for each extracted net. The parasitic extraction tool can identify parasitic values for the extracted net and generate an electrical representation of the extracted net based on the parasitic values. The parasitic values can include any resistances in the extracted net, any capacitances between the extracted net and a ground plane, any coupling capacitances between adjacent nets, any inductances, or the like. In some embodiments, the coupling capacitance in the electrical representation can model noise or cross-talk in the extracted net due to exchange of electromagnetic fields between multiple nets.

In a block 704, the parasitic extraction tool can determine whether the electrical representations form any complete parasitic electrical models. In some embodiments, the parasitic extraction tool can identify whether the electrical representation of the extracted net include a coupling capacitance, indicating another net electrically couples to the extracted net through the exchange of electromagnetic fields. When the electrical representation of the extracted net does not include any coupling capacitances, or the parasitic extraction tool selectively decoupled any coupling capacitances present in the electrical representation of the extracted net, the electrical representation of the extracted net can correspond to a complete parasitic model available to be written to a netlist.

When the electrical representation of the extracted net includes a coupling capacitance, the parasitic extraction tool can determine whether an electrical representation of the other net corresponding to the coupling capacitance has been previously extracted and converted into an electrical representation. If so, the electrical representations of both nets can be combined. When the combination of the electrical representations for both nets does not include any additional coupling capacitances, the combination of the electrical representations for both nets can correspond to a complete parasitic model available to be written to a netlist. Otherwise, when the electrical representation of the extracted net or the combination of the electrical representations for both nets includes a coupling capacitance corresponding to an unextracted net, the parasitic extraction tool can store the electrical representation of the extracted net or the combination of the electrical representations for both nets in memory until the unextracted net has been extracted, converted to an electrical representation, and that electrical representation combined with the stored electrical representation(s).

When the parasitic extraction tool determines there are no complete parasitic models available to be written to the netlist, execution continues to block 701, where a new area is defined to evaluate for the presence of nets. When the parasitic extraction tool determines there is a complete parasitic models available to be written to the netlist, execution proceeds to block 705, where the parasitic extraction tool can write each complete parasitic electrical model to a netlist.

In a block 706, the parasitic extraction tool can determine whether there are more areas to define in the physical layout. When the parasitic extraction tool determines there are more areas to define in the physical layout, execution continues to block 701, where a new area is defined to evaluate for the presence of nets. When the parasitic extraction tool determines there are no more areas to define in the physical layout, execution of the flowchart ends.

Figure 8:
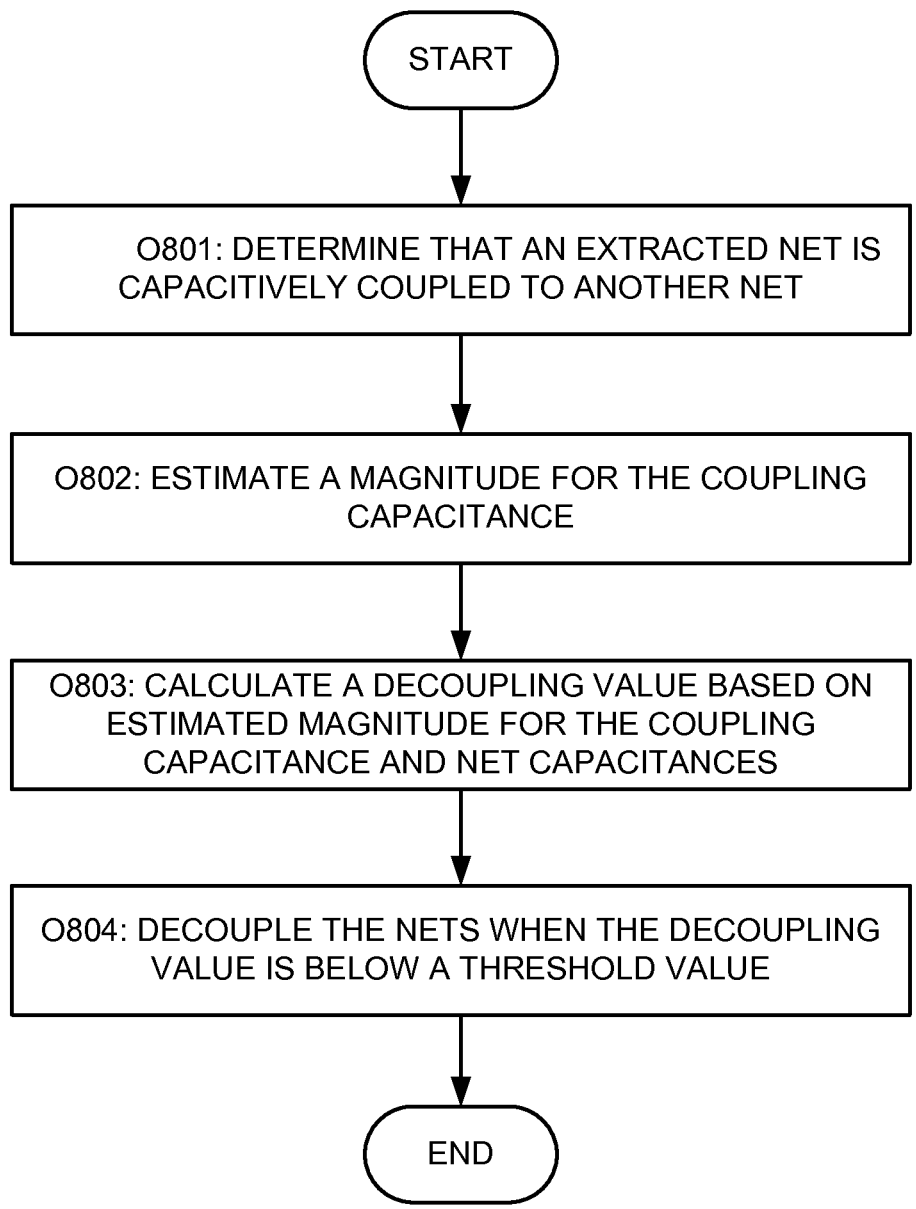
FIG. 8 illustrates a flowchart showing an example implementation of selective decoupling of extracted nets according to various examples of the invention.

FIG. 8 illustrates a flowchart showing an example implementation of selective decoupling of extracted nets according to various examples of the invention. Referring to FIG. 8, in a block 801, a parasitic extraction tool can determine that an extracted net is capacitively coupled to another net. The parasitic extraction tool can review an electrical representation of the extracted net to determine whether the electrical representation includes a coupling capacitance, and in a block 802, the parasitic extraction tool can estimate a magnitude for the coupling capacitance. Since the parasitic extraction tool estimates the magnitude for the coupling capacitance utilizing one-side of the coupling capacitance, namely, the electrical representation of the extracted net, the estimate of the coupling capacitance can be conservative, i.e., larger than the actual magnitude for the coupling capacitance.

In a block 803, the parasitic extraction tool can calculate a decoupling value based on an estimated magnitude for the coupling capacitance and total capacitances of the nets corresponding to the coupling capacitance. In some embodiments, the decoupling values can be the estimated magnitude for the coupling capacitance divided by a smallest of the two total capacitances of the nets corresponding to the coupling capacitance. The parasitic extraction tool can estimate the total net capacitances during pre-processing of the physical layout prior to initiation of the parasitic extraction, and calculate an actual total net capacitance after the net has been extracted from the physical layout. In some embodiments, the estimated total net capacitances generated during pre-processing of the physical layout can be smaller than the actual total net capacitance calculated after the net has been extracted from the physical layout. The estimates of the coupling capacitance and the total net capacitances can allow the decoupling value to be equal or larger than if the parasitic extraction tool were using actual values, rather than estimated values.

In a block 804, the parasitic extraction tool can decouple the nets when the decoupling value is below a threshold value. In some embodiments, the decoupling threshold can correspond to 3%, thus allowing the parasitic extraction tool to decouple a coupling capacitance when the estimated magnitude for the coupling capacitance is less than 3% of the smallest of the total capacitance for the nets corresponding to the coupling capacitance.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   determining, by a computing system, locations of nets in a physical layout of a circuit design;
   identifying, by the computing system, a plurality of areas in the physical layout according to a space filling curve that defines each of the plurality of areas in a sequential order, wherein each of the plurality of areas includes one or more of the plurality of areas previously defined in the sequential order;
   sequentially extracting, by the computing system in each of the plurality of areas, nets that are encapsulated within a respective area of the plurality of areas, wherein the nets correspond to electrical paths between pins in the physical layout of the circuit design;
   generating, by the computing system, electrical representations of the sequentially extracted nets; and
   generating, by the computing system, a netlist for the circuit design that includes the electrical representations generated from the sequentially extracted nets.

2. The method of claim 1, further comprising writing, by the computing system, the electrical representations to the netlist for the circuit design.

3. The method of claim 1, wherein the physical layout of the circuit design is in at least one of Library Exchange Format (LEF) or Design Exchange Format (DEF), and the netlist for the circuit design is in a Standard Parasitic Exchange Format (SPEF).

4. The method of claim 1, further comprising:
   identifying, by the computing system, coupling capacitances between a plurality of the sequentially extracted nets; and
   selectively removing, by the computing system, at least one of the coupling capacitances from the electrical representations of the sequentially extracted nets based, at least in part, on magnitude estimates of the coupling capacitances and total capacitances for the nets associated with the coupling capacitances.

5. The method of claim 4, further comprising generating, by the computing system, combined electrical representations for nets sharing at least one of the coupling capacitances after extraction of the nets sharing at least one of the coupling capacitances.

6. The method of claim 4, further comprising determining, by the computing system, the total capacitances for each of the nets prior to the sequentially extracting the nets.

7. The method of claim 1, wherein the space filling curve comprises a Z-curve, a Morton curve, or a Hilbert curve.

8. The method of claim 1, wherein generating the netlist comprises determining that the electrical representations of the sequentially extracted nets comprise a complete parasitic electrical model, and writing the complete parasitic electrical model to the netlist.

9. The method of claim 1, wherein the identifying and the sequentially extracting comprise:
   identifying a first area of the plurality of areas;
   extracting one or more nets that are encapsulated within the first area;
   identifying, after the extracting nets that are encapsulated within the first area, a second area of the plurality of areas, wherein the second area includes the first area; and
   extracting one or more nets that are encapsulated within the second area.

10. A system comprising:
    a memory device configured to store machine-readable instructions; and
    a computing system including one or more processing devices, in response to executing the machine-readable instructions, configured to:
    determine locations of nets in a physical layout of a circuit design;
    identify a plurality of areas in the physical layout according to a space filling curve that defines each of the plurality of areas in a sequential order, wherein each of the plurality of areas includes one or more of the plurality of areas previously defined in the sequential order;

sequentially extract in each of the plurality of areas, nets that are encapsulated within a respective area of the plurality of areas, wherein the nets correspond to electrical paths between pins in the physical layout of the circuit design;

generate electrical representations of the sequentially extracted nets; and generate a netlist for the circuit design that includes the electrical representations generated from the sequentially extracted nets.

11. The system of claim 10, wherein the one or more processing devices, in response to executing the machine-readable instructions, are configured to write the electrical representations to the netlist for the circuit design.

12. The system of claim 10, wherein the one or more processing devices, in response to executing the machine-readable instructions, are configured to:

identify coupling capacitances between a plurality of the sequentially extracted nets; and selectively remove at least one of the coupling capacitances from the electrical representations of the sequentially extracted nets based, at least in part, on magnitude estimates of the coupling capacitances and total capacitances for the nets associated with the coupling capacitances.

13. The system of claim 12, wherein the one or more processing devices, in response to executing the machine-readable instructions, are configured to generate combined electrical representations for nets sharing at least one of the coupling capacitances after extraction of the nets sharing at least one of the coupling capacitances.

14. The system of claim 12, wherein the one or more processing devices, in response to executing the machine-readable instructions, are configured to determine the total capacitances for each of the nets prior to the sequential extraction of the nets.

15. An apparatus comprising at least one computer-readable memory device storing instructions configured to cause one or more processing devices to perform operations comprising:

determining locations of nets in a physical layout of a circuit design;

identifying a plurality of areas in the physical layout according to a space filling curve that defines each of the plurality of areas in a sequential order, wherein each of the plurality of areas includes one or more of the plurality of areas previously defined in the sequential order;

sequentially extracting, in each of the plurality of areas, nets that are encapsulated within a respective area of the plurality of areas, wherein the nets correspond to electrical paths between pins in the physical layout of the circuit design;

generating electrical representations of the sequentially extracted nets; and generating a netlist for the circuit design that includes the electrical representations generated from the sequentially extracted nets.

16. The apparatus of claim 15, wherein the instructions are configured to cause one or more processing devices to perform operations further comprising writing the electrical representations to the netlist for the circuit design.

17. The apparatus of claim 15, wherein the physical layout of the circuit design is in at least one of Library Exchange Format (LEF) or Design Exchange Format (DEF), and the netlist for the circuit design is in a Standard Parasitic Exchange Format (SPEF).

18. The apparatus of claim 15, wherein the instructions are configured to cause one or more processing devices to perform operations further comprising:

identifying coupling capacitances between a plurality of the sequentially extracted nets; and selectively removing at least one of the coupling capacitances from the electrical representations of the sequentially extracted nets based, at least in part, on magnitude estimates of the coupling capacitances and total capacitances for the nets associated with the coupling capacitances.

19. The apparatus of claim 18, wherein the instructions are configured to cause one or more processing devices to perform operations further comprising generating combined electrical representations for nets sharing at least one of the coupling capacitances after extraction of the nets sharing at least one of the coupling capacitances.

20. The apparatus of claim 18, wherein the instructions are configured to cause one or more processing devices to perform operations further comprising determining the total capacitances for each of the nets prior to the sequentially extracting the nets.

* * * * *